(12) United States Patent
Reiter

(10) Patent No.: US 8,361,283 B2
(45) Date of Patent: Jan. 29, 2013

(54) METHOD AND APPARATUS FOR CLEANING A TARGET OF A SPUTTERING APPARATUS

(75) Inventor: Jeffrey S. Reiter, Palo Alto, CA (US)

(73) Assignee: Seagate Technology LLC, Cupertino, CA (US)

( * ) Notice: Subject to any disclaimer, the term of this patent is extended or adjusted under 35 U.S.C. 154(b) by 2186 days.

(21) Appl. No.: 11/191,014

(22) Filed: Jul. 28, 2005

(65) Prior Publication Data

US 2007/0023276 A1 Feb. 1, 2007

(51) Int. Cl.
*C23C 14/00* (2006.01)
*C23C 14/32* (2006.01)
*C25B 9/00* (2006.01)
*C25B 11/00* (2006.01)

(52) U.S. Cl. ........... 204/192.1; 204/192.32; 204/298.16; 204/298.17

(58) Field of Classification Search ............. 204/192.12, 204/298.2, 192.1, 192.32, 298.16, 298.17; 74/424.82

See application file for complete search history.

(56) References Cited

U.S. PATENT DOCUMENTS

| | | | |
|---|---|---|---|
| 4,842,703 A | 6/1989 | Class et al. | |
| 5,427,666 A | 6/1995 | Mueller et al. | |
| 5,456,796 A * | 10/1995 | Gupta et al. | 438/710 |
| 5,496,455 A * | 3/1996 | Dill et al. | 204/192.12 |
| 5,772,858 A | 6/1998 | Tepman | |
| 5,858,183 A * | 1/1999 | Wolters et al. | 204/192.17 |
| 6,168,690 B1 * | 1/2001 | Jewett et al. | 204/192.12 |
| 6,217,716 B1 * | 4/2001 | Fai Lai | 204/192.12 |
| 6,228,235 B1 * | 5/2001 | Tepman et al. | 204/298.2 |
| 6,854,351 B2 * | 2/2005 | Yabe et al. | 74/424.82 |
| 7,014,741 B2 * | 3/2006 | Rietzel et al. | 204/298.22 |
| 2003/0173207 A1 * | 9/2003 | Zhang et al. | 204/192.12 |

FOREIGN PATENT DOCUMENTS

| | | | |
|---|---|---|---|
| JP | 02254160 A | * | 10/1990 |
| JP | 09209141 A | * | 8/1997 |
| JP | 2002038264 A | * | 2/2002 |
| JP | 2003138372 A | * | 5/2003 |

* cited by examiner

*Primary Examiner* — Nicholas A Smith
*Assistant Examiner* — Michael Band

(57) ABSTRACT

The arrangement and method for sputtering material onto a workpiece and cleaning a target of the sputtering chamber includes exposing a target to an electromagnetic field of a strength sufficient to remove particles from the target. The electromagnetic field is generated by an electromagnetic device that is positioned in proximity to the target and generates a strength greater than a strength of a cathode magnetic field behind the target to safely remove the contaminating particulates from the target, which may be made of a strong magnetic material.

20 Claims, 2 Drawing Sheets

METHOD AND APPARATUS FOR CLEANING A TARGET OF A SPUTTERING APPARATUS

FIELD OF THE INVENTION

The present invention relates to the field of sputtering, and more particularly, to the cleaning of sputtering targets employed in a sputtering apparatus.

BACKGROUND OF THE INVENTION

Sputtering is a well known method of depositing a film layer onto a semiconductor substrate. A typical sputtering apparatus includes a vacuum chamber that encloses a target and a substrate support pedestal. The target is typically affixed to the top of the chamber, but is electrically isolated from the chamber walls. A voltage source maintains the target at a negative voltage with respect to the electrically grounded walls of the chamber to excite into a plasma state inert gas (typically argon) which is supplied to the chamber and maintained in the chamber at a low pressure. Ions from the plasma bombard the target and eject particles of target material from the target toward the substrate. These particles deposit on the substrate to form the desired film. While the goal of sputter deposition is to create an even deposition of a film layer onto the substrate, the sputtered particles typically deposit on other exposed chamber surfaces. In addition, a portion of the sputtered particles will typically be back sputtered onto (i.e., returned to) the target.

Magnetron sputtering is one method of increasing sputtering, and thus the deposition rate. It employs a magnetic source to create an arched magnetic field superimposed on the electric field created between the target and the grounded elements of the chamber. The magnetic source is generally provided behind the target and commonly comprises inner and outer pole pieces and a yoke connecting the opposite pole's pieces. The magnetic flux generated from this source exits from and returns to the surface of the target, thereby forming an arched magnetic field adjacent to the surface of the target. The arching magnetic field includes both parallel and perpendicular field line components relative to the target surface.

Application of a negative DC bias to a magnetron target results in a sputtering pattern having maximum erosion of the target in the regions where lines of magnetic flux are parallel with the surface of the target, in this case in the region just between the poles of the magnetic source. Where the location of a parallel component of the magnetic field remains constant during the sputtering process, the maximum erosion of the target typically takes the form of a groove in the target corresponding to the region where the magnetic field lines intersect the electric field at a right angle. Typically, such grooved erosion patterns are in the form of an oval track on the target, but depend upon the location of the stationary magnets with respect to the target surface.

If the DC bias on the target is changed to RF, the greatest sputtering will occur where the component of the magnetic field is perpendicular to the target and erode the target in areas in exact relief and complementary to the target erosion pattern created by DC bias.

The life of a target is limited by progress of erosion in the annular areas. When either DC or RF magnetron sputtering is continuously applied, the target has to be replaced frequently because of persistent target consumption in the corresponding annular grooves. As an annular groove progressively forms in the target during sputtering thereof, the slightly or non-eroded regions tend to accumulate back sputtered material because of non-erosion of these regions. Where the back sputtering material does not form a tight bond with a target, the material may flake off and contaminate a substrate. In the groove regions, any back sputtered material is quickly re-sputtered off the target.

To avoid contamination of the work piece, and extend the useful life of the target, attempts have been made to clean the targets, once removed from the sputtering chamber, to prevent particulate contamination of the work pieces being processed on an ongoing basis. Currently, when targets, such as strong magnetic materials targets, are removed from the vacuum of the process chamber, the targets typically flake and prove difficult to clean. Further, the strong cathode magnetic field behind the target makes cleaning of the strong magnetic materials targets even more difficult.

SUMMARY OF THE INVENTION

There is a need for a method and apparatus for cleaning targets of a sputtering arrangement that helps to reduce the potential for particle contamination of a workpiece.

This and other needs are met by embodiments of the present invention which provide a method of cleaning a target for a sputtering chamber, comprising the steps of removing the target from the sputtering chamber and exposing the target to a first magnetic field of a first strength sufficient to remove particles from the target. And in certain embodiments of the invention, the exposing of the target to a first magnetic field includes providing an electromagnetic device in proximity to the device and activating this electromagnetic device to create the first magnetic field. The exposing of a target to a magnetic field with a strength sufficient to remove particles from a target allows contaminating particles to be readily removed in an efficient manner. Following the cleaning of the target, a particulate free target, previously used, may be re-inserted into the sputtering apparatus and re-used without void and defect issues which may otherwise occur due to contaminating particulates still present after an incomplete cleaning process.

The earlier stated needs are also met by other embodiments of the present invention which provide a method of processing recording disks, comprising the steps of sputtering material onto a first recording disk from a target made of magnetic material, applying an electromagnetic field to remove particles from the target to clean the target, and sputtering material onto a second recording disk from the cleaned target.

The earlier stated needs are also met by still other embodiments of the present invention which provide an arrangement for sputtering material onto a work piece, comprising a target and means for removing contaminate particles from the target.

The foregoing and other features, aspects and advantages of the present invention will become more apparent from the following detailed description of the present invention when taken in conjunction with the accompanying drawings.

DETAILED DESCRIPTION

The present invention addresses and solves problems related to the cleaning of targets in a sputtering system or arrangement. In particular, the present invention addresses problems related to removing particulates from a target made of magnetic material. When strong magnetic material targets are removed from vacuum after being used in order to clean them, such targets flake and are very difficult to clean. A strong cathode magnetic field behind the target exacerbates this problem. The present invention solves this problem, in part, by exposing the target to a magnetic field of a strength sufficient to overcome the cathode magnetic field and attract contaminating particulates from the target. Once clean, a particulate-free used target may be employed in the sputter machine, thereby reducing or eliminating void and defect issues which may otherwise occur.

Figure 1:
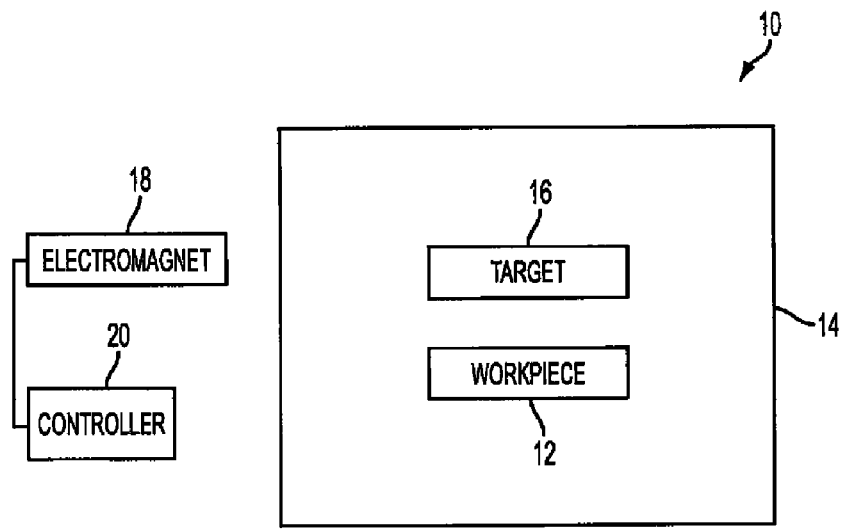
FIG. 1 is A schematic depiction of an arrangement for sputtering material onto a work piece, such as a recording disk, constructed in accordance with embodiments of the present invention.

FIG. 1 is a schematic depiction of an arrangement 10 for sputtering material onto a workpiece 12. The details of the arrangement 10 will not be depicted or described, as the present invention is applicable to various types of sputtering machines. Hence, the internal details of the sputtering chamber 14 and its connections, such as power supply, gas sources, etc., are not shown.

Inside the sputtering chamber 14 is a target 16. In certain embodiments of the invention, the target 16 is made of a strong magnetic material. As discussed earlier, it is difficult to remove contaminating particulates from a target made of strong magnetic material. However, such targets may flake when removed from the vacuum of the processing chamber 14 during cleaning processes. Upon re-insertion, the incomplete cleaning of a used target presents a possibility of void and defects and contamination occurring on the work piece.

The present invention employs an electromagnet device 18 that is activated and controlled to produce an electromagnetic force of sufficient strength to attract and remove the particulates from the target 16. In FIG. 1 the electromagnetic device 18 is external to the sputtering chamber 14. Upon completion of the sputtering processes for one or more work pieces 12, such as recording disks, the target 16 is removed from the vacuum of the sputtering chamber 14 for cleaning. Such a cleaning is necessitated by the formation of contaminants on the target 16, as described earlier. Continued processing with a contaminated target leads to undesirable quality of the films produced on the work piece 12.

Following the removal of the target 16 from the processing chamber 14, the electromagnetic device 18 is provided in proximity to the target 16. The proximity of the electric magnetic device 18 to the target 16 will depend upon the strength of the electromagnetic field that can be generated by the electromagnetic device 18, and the strength of the cathode electromagnetic field at the target 16. Generally, the closer the electromagnetic device 18 may approach the surface of the target 16, the lesser the amount of electromagnetic force is required to be generated by the electromagnetic device 18 to attract the particulates away from the target 16.

The electromagnetic device 18 is controlled by a controller 20. In certain embodiments of the invention, the controller 20 is able to vary the amount of the electromagnetic force applied by the electromagnetic device 18.

In addition to the removal of particulates by the electromagnetic device 18, other types of traditional cleaning processes may be employed to clean the target 16. Once clean, however, the used target 16 may be re-inserted into the sputtering chamber 14. The continued processing of work pieces 12, such as sputtering materials onto a newly inserted work piece 12, is performed.

Hence, the present invention allows for a method of processing recording disks in which material is sputtered onto a first recording disk, such as represented by workpiece 12. Following the sputtering of material onto the first recording disk, an electric magnetic field is applied by the electromagnetic device 18 to remove particles from the target 16 to clean the targets 16. Material can then be sputtered onto a second recording disk 12 from the cleaned target 16.

Figure 2:
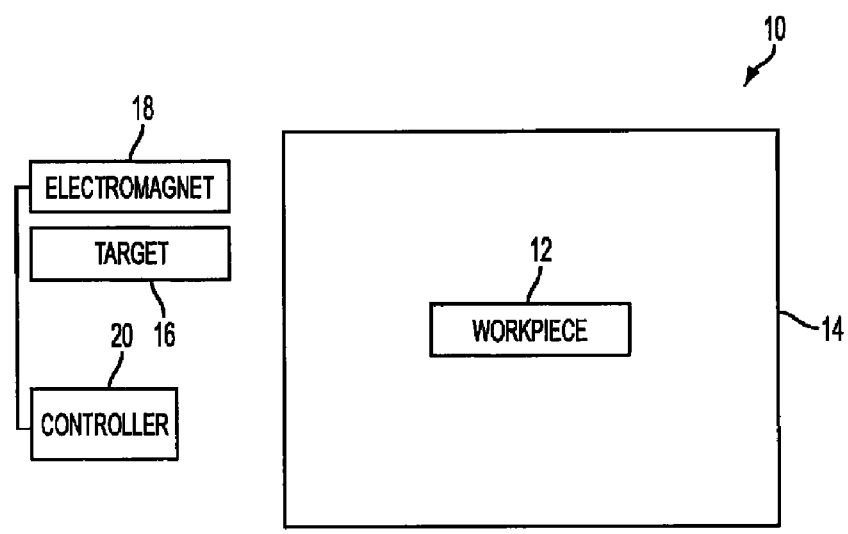
FIG. 2 shows the structure of FIG. 1, with a target removed from a processing chamber and subjected to cleaning in accordance with embodiments of the present invention.
Figure 3:
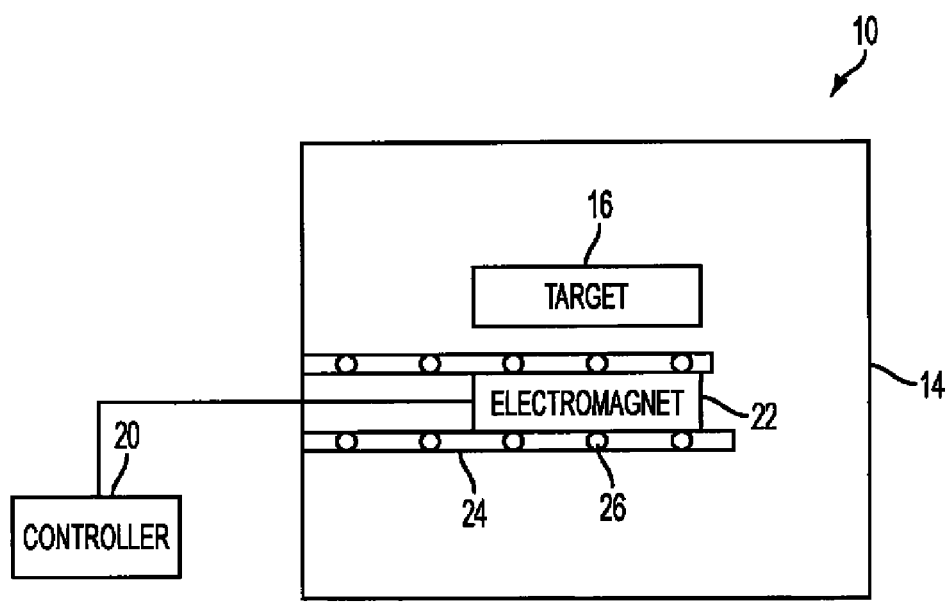
FIG. 3 depicts an alternate embodiment of the present invention in which the cleaning of the target is performed in situ.

The embodiment of FIGS. 1 and 2 depict an arrangement in which the electromagnetic device 18 is maintained externally to the target 16. In such embodiments, the target 16 is removed from the sputtering chamber 14. Then in certain other embodiments, an in situ cleaning is provided. Such an arrangement is depicted in FIG. 3, in which an electromagnetic device 22 is provided within the sputtering chamber 14. The insertable electromagnetic device 22 is provided within the processing chamber 14 after sputtering processes are stopped.

As depicted in FIG. 3, the electromagnetic device 22 is inserted on a track 24, and rolled on bearings or rollers 26. Alternatively, the electromagnetic device 22 can be attached to an extendable slide arrangement (not shown). Other arrangements for moving and holding the electromagnetic device 22 within the sputtering chamber 14 may be employed without departing from the scope of the invention. The electromagnetic device 22 is activated to remove the particulates from the target 16, with the track 24 or other arrangement maintaining a physical separation from the target 16 during the actuation of the electromagnetic device 22. This prevents any damage to the target that could otherwise occur upon actuation and movement of the electromagnetic device 22 against the surface of the target 16.

Following the actuation of the electromagnetic device 22, the electromagnetic device can be removed from the processing chamber 14. One advantage of this embodiment is the cleaning of the target 16 without removing it from the processing chamber 14 to allow more processing of disks or workpieces 12 to occur prior to removal of the target 16. Hence, this embodiment allows for at least a partial, if not a full, cleaning of the target 16 with a minimum amount of down time.

The present invention provides for removal of particulates from a target of a sputtering chamber in an advantageous and economical manner.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of cleaning a target for a sputtering chamber, comprising the steps:
   removing the target from the sputtering chamber; and
   exposing the target to a first magnetic field of a first strength sufficient to attract and remove particles from the target.

2. The method of claim 1, wherein the target is made of a magnetic material and has a cathode magnetic field of a second strength.

3. The method of claim 2, wherein the first strength is greater than the second strength.

4. The method of claim 3, wherein the step of exposing the target includes providing an electromagnetic device in proximity to the target and activating the electromagnetic device to create the first magnetic field.

5. The method of claim 4, wherein the first magnetic field is of a same polarity as the polarity of the cathode magnetic field.

6. The method of claim 5, further comprising controlling the electromagnetic device to vary the strength of the first magnetic field until at least the first strength is achieved.

7. The method of claim 4, further comprising controlling the electromagnetic device to vary the strength of the first magnetic field until at least the first strength is achieved.

8. A method of cleaning a target for a sputtering chamber, comprising the steps of:
   inserting an electromagnetic device into the sputtering chamber in proximity to the target; and
   activating the electromagnetic device to create a first magnetic field, wherein the first magnetic field has a first strength sufficient to attract and remove particles from the target.

9. The method of claim 8, wherein the target is made of a magnetic material and has a cathode magnetic field of a second strength.

10. The method of claim 9, wherein the first strength is greater than the second strength.

11. The method of claim 8, wherein the first magnetic field is of a same polarity as the polarity of the cathode magnetic field.

12. The method of claim 8, further comprising controlling the electromagnetic device to vary the strength of the first magnetic field until at least the first strength is achieved.

13. The method of claim 8, wherein the electromagnetic device is inserted on a track and rolled into the sputtering chamber in proximity to the target.

14. The method of claim 8, wherein the electromagnetic device is attached to an extendable slide and slid into the sputtering chamber in proximity to the target.

15. A method of cleaning a target for a sputtering chamber, comprising the steps of:
   providing an electromagnetic device in proximity to the target and activating the electromagnetic device to create a first magnetic field,
   exposing the target to the first magnetic field, wherein the first magnetic field has a first strength sufficient to attract and remove particles from the target, and
   wherein the target is made of a magnetic material and has a cathode magnetic field of a second strength, and the first strength is greater than the second strength.

16. The method of claim 15, wherein the first magnetic field is of a same polarity as the polarity of the cathode magnetic field.

17. The method of claim 15, further comprising controlling the electromagnetic device to vary the strength of the first magnetic field until at least the first strength is achieved.

18. The method of claim 15, further comprising removing the target from the sputtering chamber prior to exposing the target to the first magnetic field.

19. The method of claim 15, wherein the electromagnetic device is inserted on a track and rolled into the sputtering chamber in proximity to the target.

20. The method of claim 15, wherein the electromagnetic device is attached to an extendable slide and slid into the sputtering chamber in proximity to the target.

* * * * *